(12) United States Patent
Hanley

(10) Patent No.: US 7,615,712 B2
(45) Date of Patent: Nov. 10, 2009

(54) INTEGRATED CIRCUIT PACKAGES INCLUDING DAMMING AND CHANGE PROTECTION COVER FOR HARSH ENVIRONMENTS

(75) Inventor: Hugh Patton Hanley, Katy, TX (US)

(73) Assignee: Smith International, Inc., Houston, TX (US)

( * ) Notice: Subject to any disclaimer, the term of this patent is extended or adjusted under 35 U.S.C. 154(b) by 275 days.

(21) Appl. No.: 11/590,229

(22) Filed: Oct. 31, 2006

(65) Prior Publication Data
US 2008/0112143 A1    May 15, 2008

(51) Int. Cl.
*H01L 23/28* (2006.01)
(52) U.S. Cl. .................. 174/523; 174/521; 174/528
(58) Field of Classification Search ............. 174/521, 174/523, 528, 532; 257/787
See application file for complete search history.

(56) References Cited

U.S. PATENT DOCUMENTS

| | | | |
|---|---|---|---|
| 4,701,999 A | 10/1987 | Palmer | |
| 4,891,734 A | 1/1990 | More et al. | |
| 5,130,781 A * | 7/1992 | Kovac et al. | 257/788 |
| 5,332,864 A * | 7/1994 | Liang et al. | 174/523 |
| 5,469,333 A * | 11/1995 | Ellerson et al. | 361/779 |
| 5,914,864 A | 6/1999 | MacDonald, Jr. et al. | |
| 6,311,621 B1 | 11/2001 | Marshall et al. | |
| 6,437,239 B1 * | 8/2002 | Zayatz | 174/527 |
| 7,296,299 B2 * | 11/2007 | Schwenck et al. | 726/34 |
| 2005/0093201 A1 | 5/2005 | Groth | |
| 2006/0043635 A1 | 3/2006 | Groth | |

* cited by examiner

Primary Examiner—Hung V Ngo

(57) ABSTRACT

An electronic assembly for use in a downhole tool includes a damming boot deployed about at least one integrated circuit component on a circuit board. The boot is disposed to house the integrated circuit leads and solder joints in a substantially sealed cavity between the circuit board, the integrated circuit body, and an inner surface of the damming boot. The boot is also disposed to support the integrated circuit body and thereby improve the shock and vibration resistance of various electronic assemblies used in downhole tools. The invention also tends to improve the reworkability of downhole electronic assemblies.

15 Claims, 5 Drawing Sheets

INTEGRATED CIRCUIT PACKAGES INCLUDING DAMMING AND CHANGE PROTECTION COVER FOR HARSH ENVIRONMENTS

RELATED APPLICATIONS

None.

FIELD OF THE INVENTION

This invention relates generally to integrated circuit board packages for use in downhole tools, and in particular to an integrated circuit board for use in a downhole tool having at least one damming boot deployed about an electronic component (integrated circuit) deployed on the circuit board.

BACKGROUND OF THE INVENTION

In recent years there has been a marked increase in the sophistication of downhole tools, and in particular, downhole tools deployed in the bottom hole assembly (BHA) of a drill string. A typical BHA commonly includes, for example, one or more logging while drilling (LWD) and/or measurement while drilling (MWD) tools. Such tools are known to include various electronic sensors such as gamma ray sensors, neutron sensors, resistivity sensors, formation pressure and temperature sensors, ultrasonic sensors, audio-frequency acoustic sensors, magnetic sensors, acceleration sensors, and the like, as well as electronic memory to store the various sensor measurements. Moreover, a typical BHA further includes other tools, such as a telemetry tool, a formation sampling tool, and/or a rotary steerable tool, which include electronic controllers disposed to control, monitor, and record various tool functions during drilling.

It is well known in the art that severe dynamic conditions are often encountered during drilling. Commonly encountered dynamic conditions include, for example, bit bounce, lateral shock and vibration, and stick/slip. Bit bounce includes axial vibration of the drill string, often resulting in temporary lift off of the drill bit from the formation ("bouncing" of the drill bit off the bottom of the borehole). Lateral shocks and vibrations are those which are transverse to the axis of the drill string and are often due to impact of the BHA with the borehole wall. Stick/slip refers to a torsional vibration induced by friction between drill string components and the borehole wall. Stick/slip causes rapid rotational acceleration and deceleration of the drill string and is known to produce instantaneous drill string rotation speeds many times that of the nominal rotation speed of the table. Bit bounce, lateral shock and vibration, and stick/slip are commonly recognized as leading causes of electronic failures in downhole tools. These electronic failures often result in costly trips (tripping the drill string in and out of the borehole) to repair or replace damaged tools and/or tool components.

Due in part to the above described dynamic conditions, the use of integrated circuit boards in downhole tools (e.g., in electronic sensors and controllers) poses no small challenge. Typically, downhole tools must be designed to withstand shock levels in the range of 1000 G on each axis and vibration levels of 50 G root mean square. Moreover, integrated circuit boards and circuit board components must typically be able to withstand temperatures ranging up to about 200 degrees C.

Potting and/or encapsulating electronic assemblies to protect them from vibration, shock, and/or thermal exposure is well known. For example, U.S. Pat. No. 4,891,734 to More (hereafter referred to as the More patent), discloses encapsulating an entire electronic assembly (with the exception of a connector) in an elastomeric material. The elastomeric material is molded about the circuit board and shaped to fit a confining enclosure, such as a tubular shroud and/or a strongback.

One drawback with encapsulation processes is that it is difficult to access and repair an electronic assembly once it has been encapsulated. While the encapsulating material can be removed, or partially removed, from the electronic assembly, its removal is time consuming and difficult. Removal of the encapsulating layer or layers also often causes further damage to the electronic assembly (e.g., broken leads and/or solder joints). Another drawback of encapsulation processes is that during encapsulation conformal coating and/or elastomeric encapsulation materials commonly migrate underneath electronic components mounted on the circuit board. Expansion and contraction of these materials with changing temperatures (e.g., during use of a downhole tool in a borehole) is known to fatigue, or even fracture, solder joints, thereby causing failure of the electronic assembly.

While various methods have been employed to overcome the above described problems associated with encapsulation, these methods are not without their own drawbacks. For example, in one known process, a silicon-based caulking material is applied to the component leads to prevent the encapsulating materials from migrating under the components. In another known processes, a tape may be applied to the component leads. While these approaches can be somewhat effective at preventing ingress of the encapsulating materials, they tend to be time consuming and therefore expensive. Both approaches are also known to be susceptible to the build up of static charges that can cause reliability problems and even failure of sensitive integrated circuits. For example, installation and removal of tape from the component leads is known to sometimes cause large and damaging static charges. Thermal expansion and contraction of the caulk is also known to sometimes result in a build up of static charge (as are downhole tool vibrations). The caulking material also tends to further exacerbate difficulties in accessing and repairing an encapsulated assembly.

Gross, in U.S. Patent Publications 2005/0093201 and 2006/0043635 (referred to herein as the Gross publications), discloses an alternative approach in which an electronic circuit board is enclosed in a two-piece molded pre-form. While this approach might be expected to overcome the above described difficulties associated with encapsulation, it is not without its own difficulties. One particular difficulty is that printed electronic assemblies (including the printed circuit boards and electronic components/integrated circuits soldered thereto) do not typically have tight size or placement tolerances. This difficulty may be exacerbated by intermediate fabrication steps such as the aforementioned taping and/or caulking of the component leads. As such, there is difficulty in achieving a consistent snug fit of the pre-forms about the electronic assemblies. This tends to reduce the effectiveness of the vibration and shock isolation afforded by the molded perform since the electronic assembly can vibrate in the molded perform if it is not held snugly therein. The result can be more frequent failure of electronic components downhole. Molded pre-forms also frequently need to be resized (trimmed) in order to fit over the circuit board. Such resizing is time consuming and results in an unacceptably high degree of variability in the "snugness" of the fit.

Therefore, there is a need in the art for an electronic assembly having improved protection from vibration, shock, and thermal exposure, such as experienced, for example, in downhole drilling applications.

SUMMARY OF THE INVENTION

The present invention addresses one or more of the above-described shortcomings of prior art electronic assemblies for use in downhole applications. Aspects of this invention include an electronic assembly in which a damming boot is deployed about at least one integrated circuit component on a circuit board. The boot is sized and shaped such that an inner surface thereof sealingly engages an outer peripheral surface of the integrated circuit. A lower face of the boot sealingly engages the circuit board and is typically sealed to the circuit board via an adhesive. In this manner, the damming boot is disposed to house the integrated circuit leads and solder joints in a substantially sealed cavity between the circuit board, the integrated circuit body, and an inner surface of the damming boot. In one exemplary embodiment, the damming boot further includes an enlarged lower opening sized and shaped to provide a gap between an inner surface of the lower opening and the integrated circuit leads. The electronic assembly, including the damming boots, may be optionally coated or encapsulated in substantially any suitable conformal coating or encapsulating material.

Exemplary embodiments of the present invention advantageously provide several technical advantages. For example, as stated above, exemplary embodiments of this invention seal the integrated circuit leads in a cavity between the circuit board, the integrated circuit body, and an inner surface of the damming boot, thereby substantially preventing conformal coating and/or encapsulation materials from migrating under the integrated circuit. The use of damming boots in accordance with this invention obviates the need for the above mentioned caulking and/or taping procedures. As such, the invention advantageously tends to eliminate static charge problems associated with the use of conventional caulks and tapes.

The present invention also tends to advantageously improve the reworkability of downhole electronic assemblies. The damming boot(s) may typically be quickly and easily removed from the integrated circuit and the circuit board (even after encapsulation thereof). Moreover, protection of the integrated circuit leads in the aforementioned cavity eliminates the need to remove caulking, tape, conformal coating, and/or encapsulation material from the leads. As a result, downhole electronic assemblies, including sensitive leads and solder joints, may be visually inspected and/or reworked quickly and efficiently, producing less scrap and commonly enabling circuit board and integrated circuit components to be repaired and re-used multiple times.

The present invention has also been found to advantageously improve the shock and vibration resistance of various electronic assemblies used in downhole tools. In particular, incidents of failure to the integrated circuit leads and solder joints may be reduced, thereby improving downhole tool reliability and reducing costly trips into and out of the borehole.

In one aspect this invention includes an electronic assembly for a downhole tool. The assembly includes a circuit board having a plurality of integrated circuits deployed thereon. Each integrated circuit includes a plurality of electrically conductive leads protruding from a solid body by which the integrated circuits are in electrical communication with the circuit board. The assembly further includes at least one damming boot deployed about at least one of the integrated circuits. The damming boot is sized and shaped such that an inner surface thereof sealingly engages an outer, peripheral surface of the integrated circuit body portion. A lower face of the damming boot sealingly engages the circuit board.

In another aspect, this invention includes a damming boot for deployment about an integrated circuit component. The damming boot includes a molded housing sized and shaped to be deployed about a predetermined integrated circuit deployed on a circuit board such that an inner surface of the housing sealing engages an outer, peripheral surface of a body portion of the integrated circuit. The housing further includes a lower face disposed to sealingly engage the circuit board. The housing also includes an enlarged lower opening sized and shaped to provide a gap between an inner surface of the lower opening and a plurality integrated circuit leads.

In another aspect this invention includes a method for fabricating an electronic assembly for use in a downhole tool. The method includes providing a circuit board having a plurality of integrated circuits soldered thereto and deploying a damming boot about at least one of the integrated circuits. The damming boot includes a housing sized and shaped to be deployed about the at least one integrated circuit such that an inner surface of the housing sealing engages an outer, peripheral surface of a body portion of the at least one integrated circuit. The housing also includes a lower face disposed to sealingly engage the circuit board.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
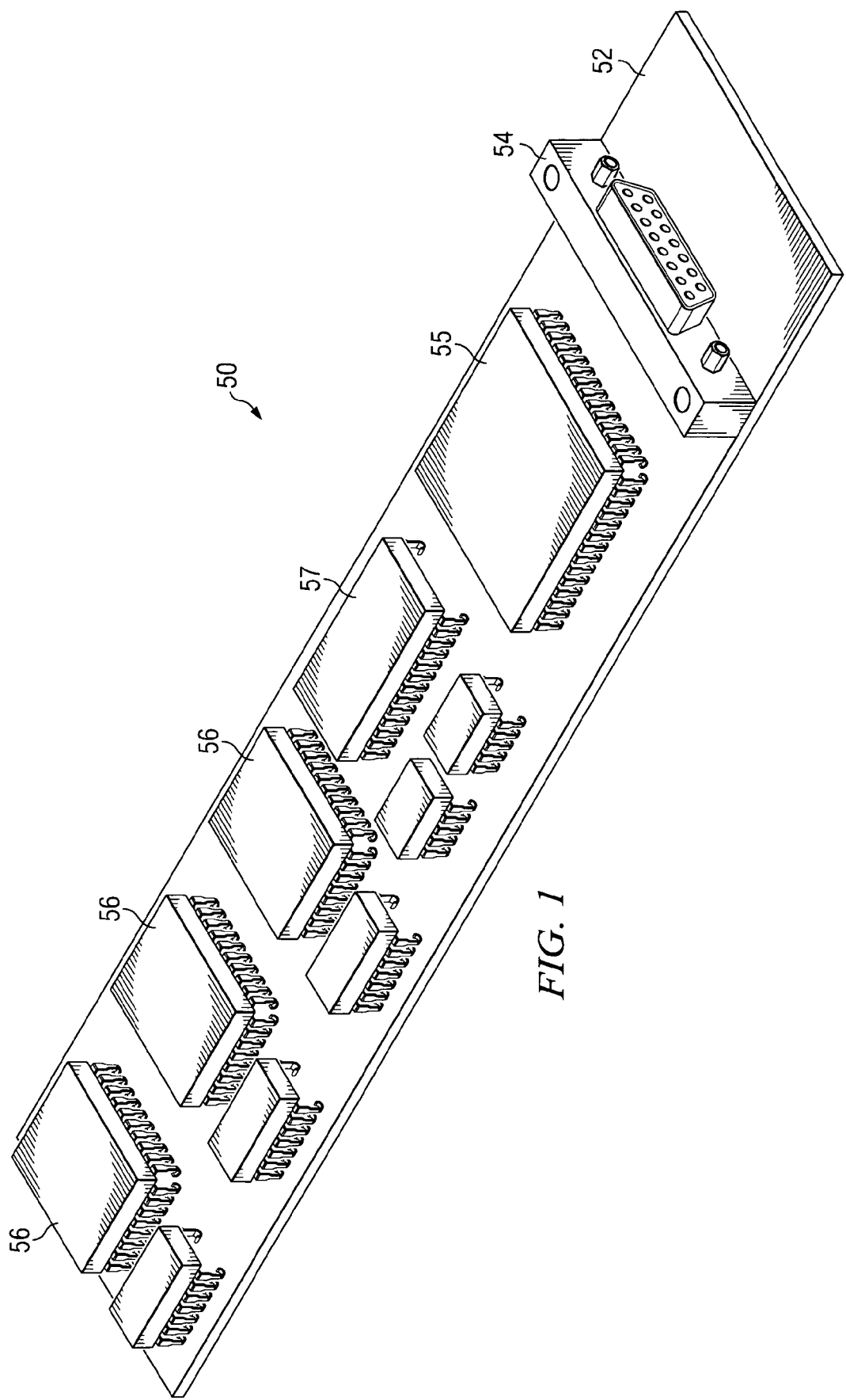
FIG. 1 depicts an electronic circuit board assembly prior to installation of one or more exemplary damming boots of the present invention.

Referring first to FIGS. 1 through 7, it will be understood that features or aspects of the exemplary embodiments illustrated may be shown from various views. Where such features or aspects are common to particular views, they are labeled using the same reference numeral. Thus, a feature or aspect labeled with a particular reference numeral on one view in FIGS. 1 through 7 may be described herein with respect to that reference numeral shown on other views.

Turning now to FIG. 1, an exemplary electronic assembly 50 upon which exemplary damming boot embodiments 120 (FIG. 2) of this invention may be deployed. Electronic assembly 50 includes a circuit board 52 (such as a conventional printed circuit board) having a plurality of integrated circuit components 55, 56, and 57 soldered thereto. The assembly 50 further includes an electronic connector 54 for making electronic connection to various other downhole devices. Electronic assembly 50 (and therefore circuit board 52) may be sized and shaped, for example, for deployment in a strongback, such as a disclosed in the More patent. As described above, the More patent discloses encapsulating the electronic assembly in an elastomeric material to provide shock and vibration isolation. As also described above, during encapsulation the encapsulating material tends to migrate under the electronic components (e.g., components 55, 56, and 57), which often results in failure of the leads during thermal cycling. Encapsulation of the soldered leads also makes repair and rework difficult and tedious at best. Removal of the encapsulation material and/or other conformal material from the leads and solder joints is known to commonly damage or destroy the electronic component. As further described above, the application of silicon-based caulk or tape to the leads is time consuming and can result in static charge induced damage to sensitive components.

Figure 2:
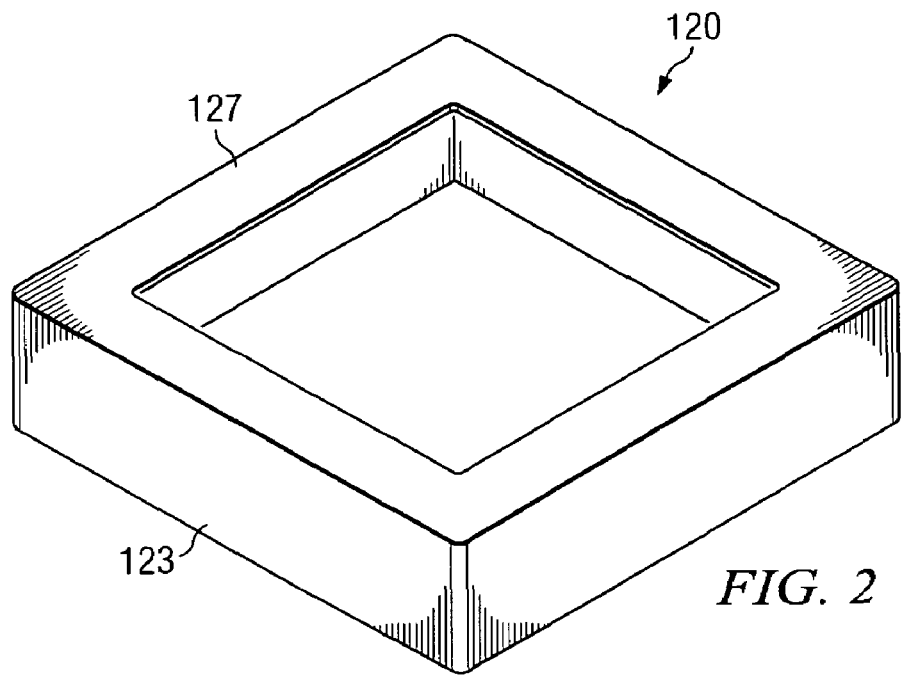
FIG. 2 depicts one exemplary embodiment of a damming boot in accordance with the present invention.
Figure 3A:
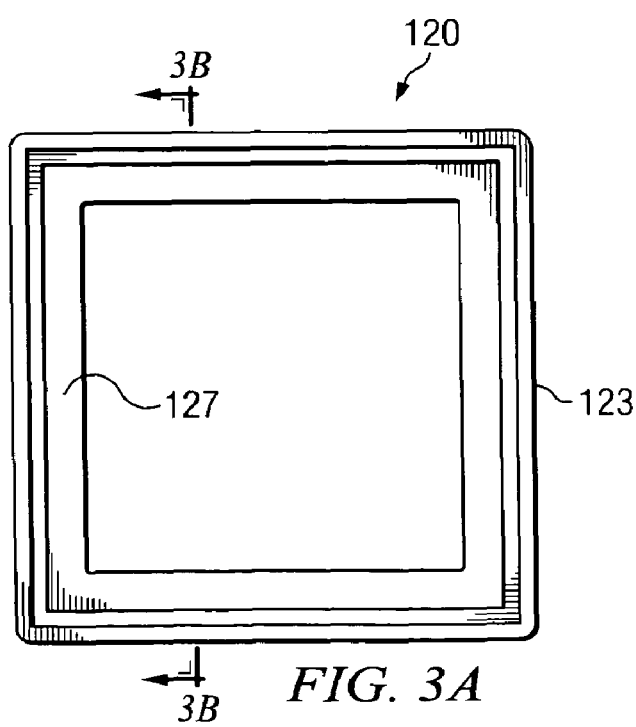
FIGS. 3A and 3B depict bottom and cross sectional views of the exemplary embodiment shown on FIG. 2.
Figure 3B:
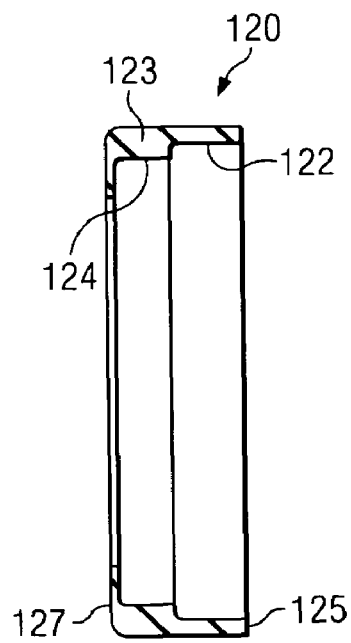

With reference now to FIGS. 2, 3A, and 3B, one exemplary embodiment of a damming/charge protection boot 120 in accordance with the present invention is shown. In the exemplary embodiment shown, boot 120 includes side walls 123 and a partial top/covering 127. The boot 120 includes an open bottom such that it may be deployed over and about an integrated circuit component on a circuit board (e.g., about integrated circuit 55 on circuit board 52). Damming boots 120 in accordance with this invention are typically injection molded from a material having a low coefficient of thermal expansion, such as RYTON® (polyphenylenesulphide) or PEEK® (polyetheretherketones). Advantageous materials typically have a thermal expansion coefficient less than about $16 \times 10^{-6}$. The material is also preferably non-conductive electrically, provides suitable adhesion for epoxies, and is capable of providing structural integrity and strength at high temperatures (e.g., up to about 250 degrees C.). In order to provide suitable adhesion for epoxies, damming boots fabricated from PEEK may be etched with an acidic solution. It will be appreciated that exemplary embodiments of damming boots 120 may be equivalently machined from any suitable material. The invention is not limited to either the method or the material of manufacture.

Figure 4:
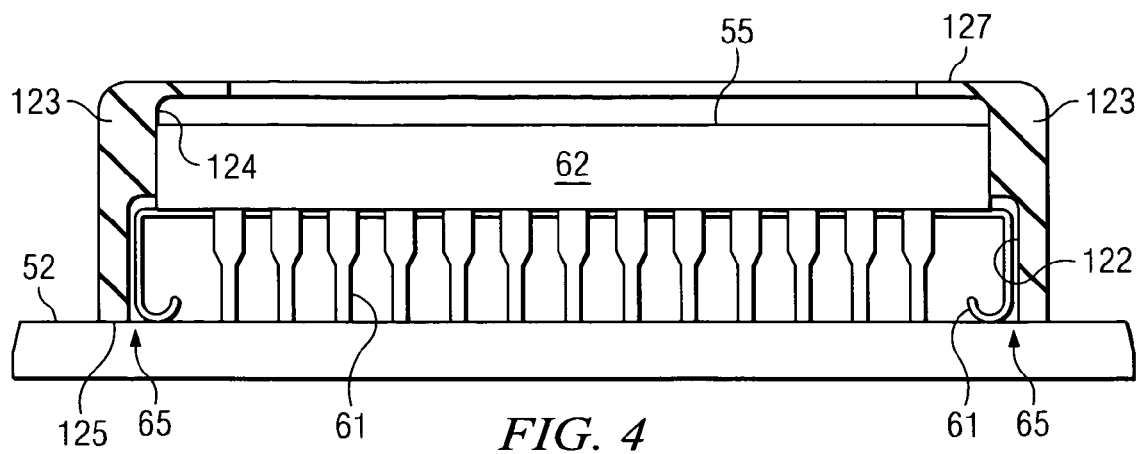
FIG. 4 depicts a cross sectional view of the exemplary damming boot of FIG. 2 deployed about one of the electronic components on the exemplary circuit board assembly of FIG. 1.
Figure 5:
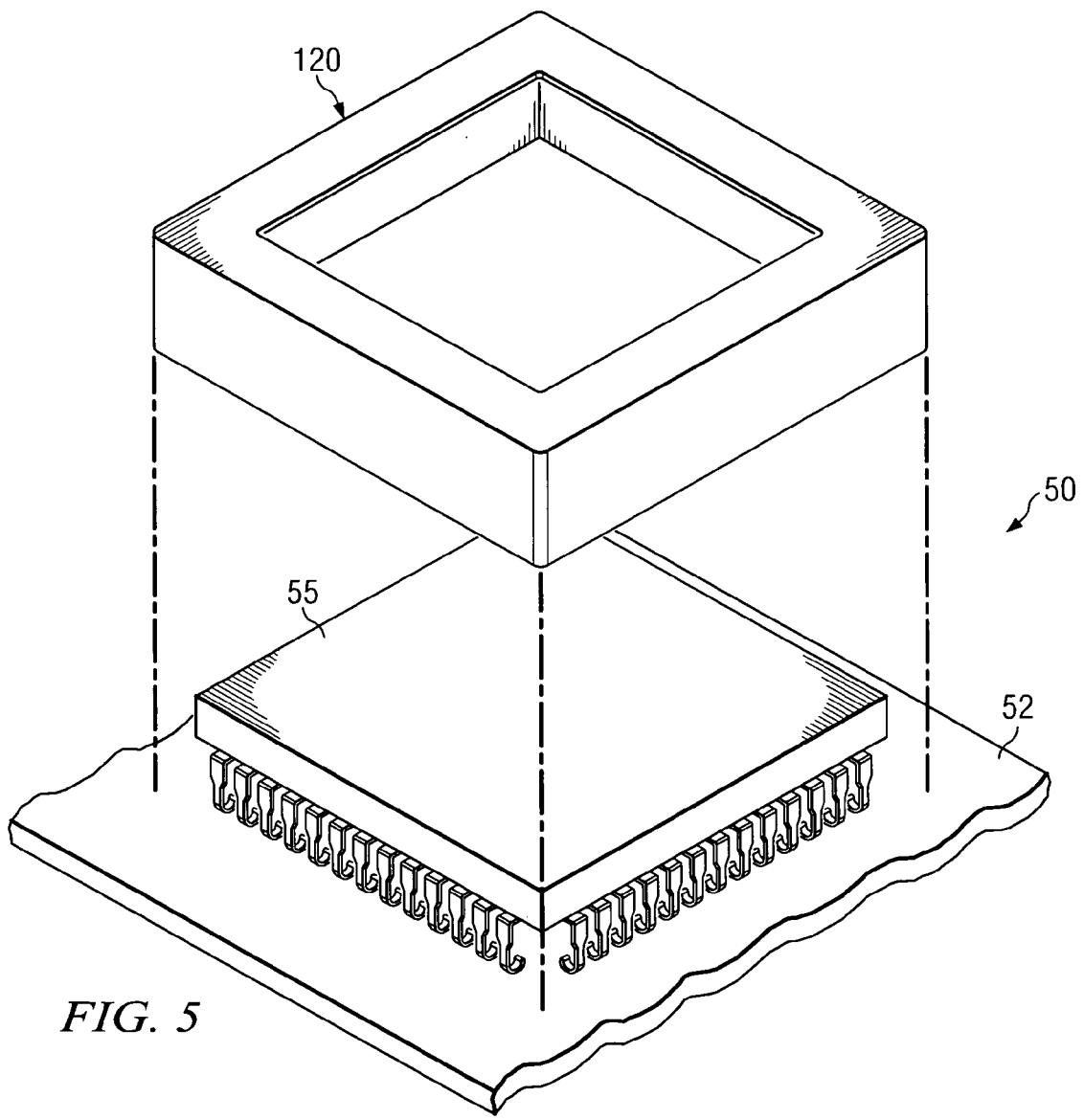
FIG. 5 depicts the damming boot and electronic component of FIG. 4 in perspective view.

With further reference now to FIGS. 4 and 5, damming boot 120 is shown deployed about an exemplary 52-pin programmable logic chip carrier (PLCC) integrated circuit 55 which is soldered to circuit board 52. As shown, the boot 120 is preferably sized and shaped to fit closely about both body portion 62 and leads 61 of the integrated circuit 55. In particular, boot 120 is sized and shaped such that opening 124 fits tightly about body portion 62, thereby forming a seal which substantially prevents the ingress of conformal coating and/or encapsulation materials. In the exemplary embodiment shown, boot 120 further includes an enlarged opening 122 which is sized and shaped to fit loosely about leads 61, such that a narrow gap 65 is provided between the leads/solder joints and the boot 120. Gap 65 is preferably narrow enough to preserve circuit board 52 real estate, but sufficiently wide so that the boot 120 does not contact either the leads 61 or the solder (not shown) between the leads 61 and the circuit board 52. After deployment of the boot 120 about integrated circuit 55, a lower face 125 thereof is typically sealed and/or joined to the circuit board 52 via an adhesive (such as a conventional epoxy compound), which advantageously substantially prevents ingress of conformal coating and/or encapsulation materials.

It will be appreciated that, while the exemplary embodiment of boot 120 shown on FIGS. 2 through 5 is deployed about a PLCC integrated circuit, the invention is not limited to any particular type of integrated circuit component. Damming boots may be equivalently utilized to support and/or protect substantially any type of integrated circuit, including, for example, dual inline packages (DIP), small outline integrated circuits (SOIC), leadless chip carriers (LCC), traditional metal can packages (TO), thin small-outline packages (TSOP), crystal packages, and the like.

Figure 6:
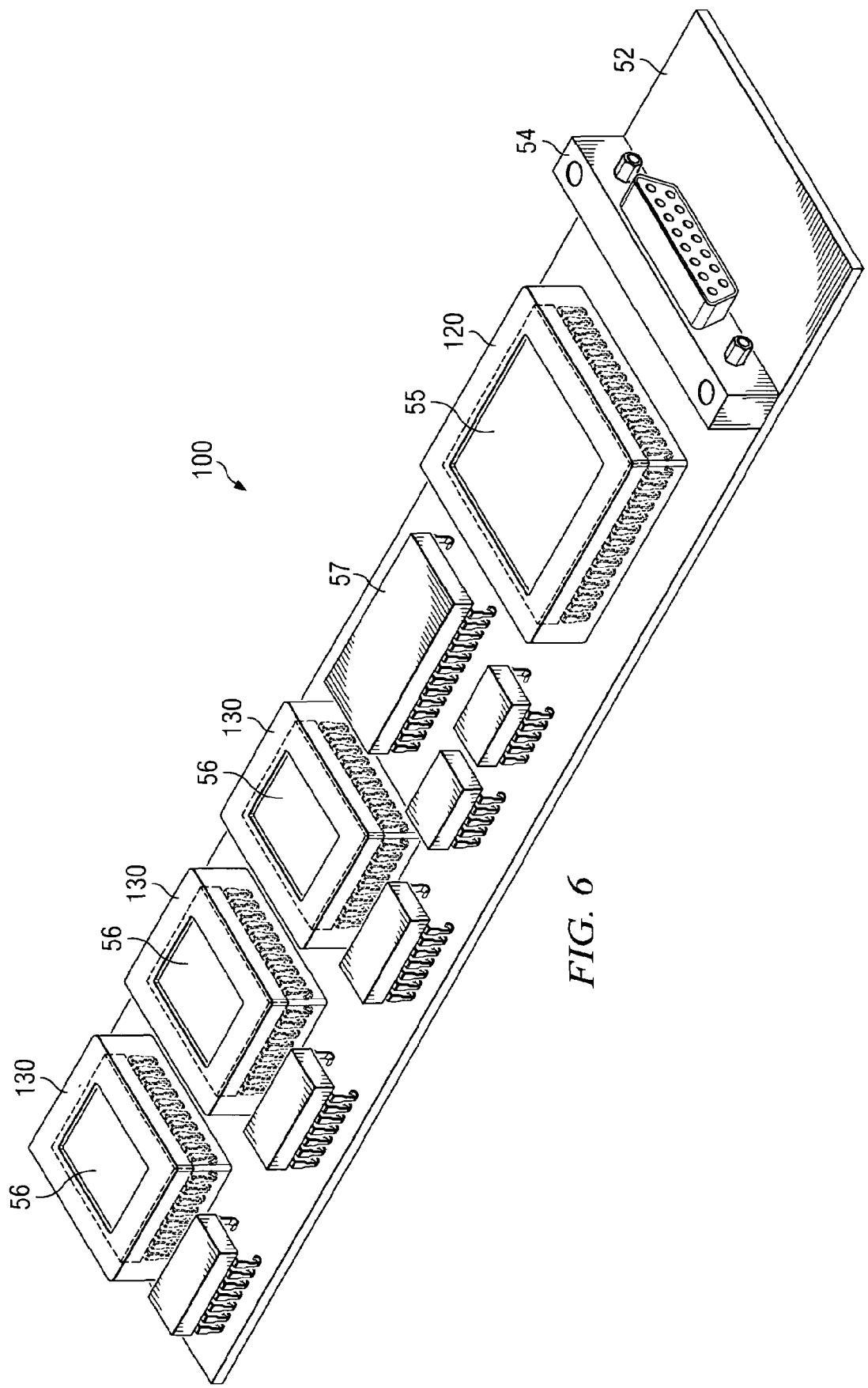
FIG. 6 depicts the exemplary circuit board assembly of FIG. 1 including a plurality of damming boots deployed about a corresponding plurality of electronic components.

With reference now to FIG. 6, an exemplary electronic assembly 100 having damming boots 120 and 130 deployed about integrated circuits 55 and 56 is shown. In the exemplary embodiment shown, boot 120 is identical to that described above with respect to FIGS. 2 through 5 and is deployed about 52-pin PLCC integrated circuit 55 as described above. Boots 130 are similar to boot 120, but are sized and shaped for deployment about corresponding 32-pin PLCC integrated circuits 56. While not shown on FIG. 6, suitable damming boots may also be deployed over some or all of the other integrated circuits deployed on circuit board 52 (e.g., on integrated circuit 57).

The deployment of exemplary damming boots (such as boots 120 and 130 shown on FIG. 6) about selected integrated circuits has been found to provide several technical advantages. For example, as described above, exemplary damming boots in accordance with this invention advantageously form a seal between the integrated circuit and the circuit board thereby substantially eliminating the ingress of conformal coating and/or encapsulation materials. Moreover, the seal is provided without contacting sensitive leads and solder joints (as with the prior art caulking compounds described above). As such, the aforementioned problems with static charge build up and lead and solder joint damage tend to be substantially eliminated. The use of damming boots in accordance with this invention also tends to provide for easier visual inspection and reworking of electronic assemblies, since the damming boot(s) may typically be quickly and easily removed from the assembly (even after encapsulation of the entire assembly). The use of exemplary damming boots in accordance with this invention has also been found to advantageously improve the shock and vibration resistance of the electronic assemblies, e.g., negating unbalanced stresses associated with pre-forms. It is believed that the physical support provided to the integrated circuit(s) about which the boot(s) are deployed (e.g., via the sealed interfaces described above) provides for better lead compliance and therefore reduced fatigue to sensitive leads and solder joints.

Figure 7:
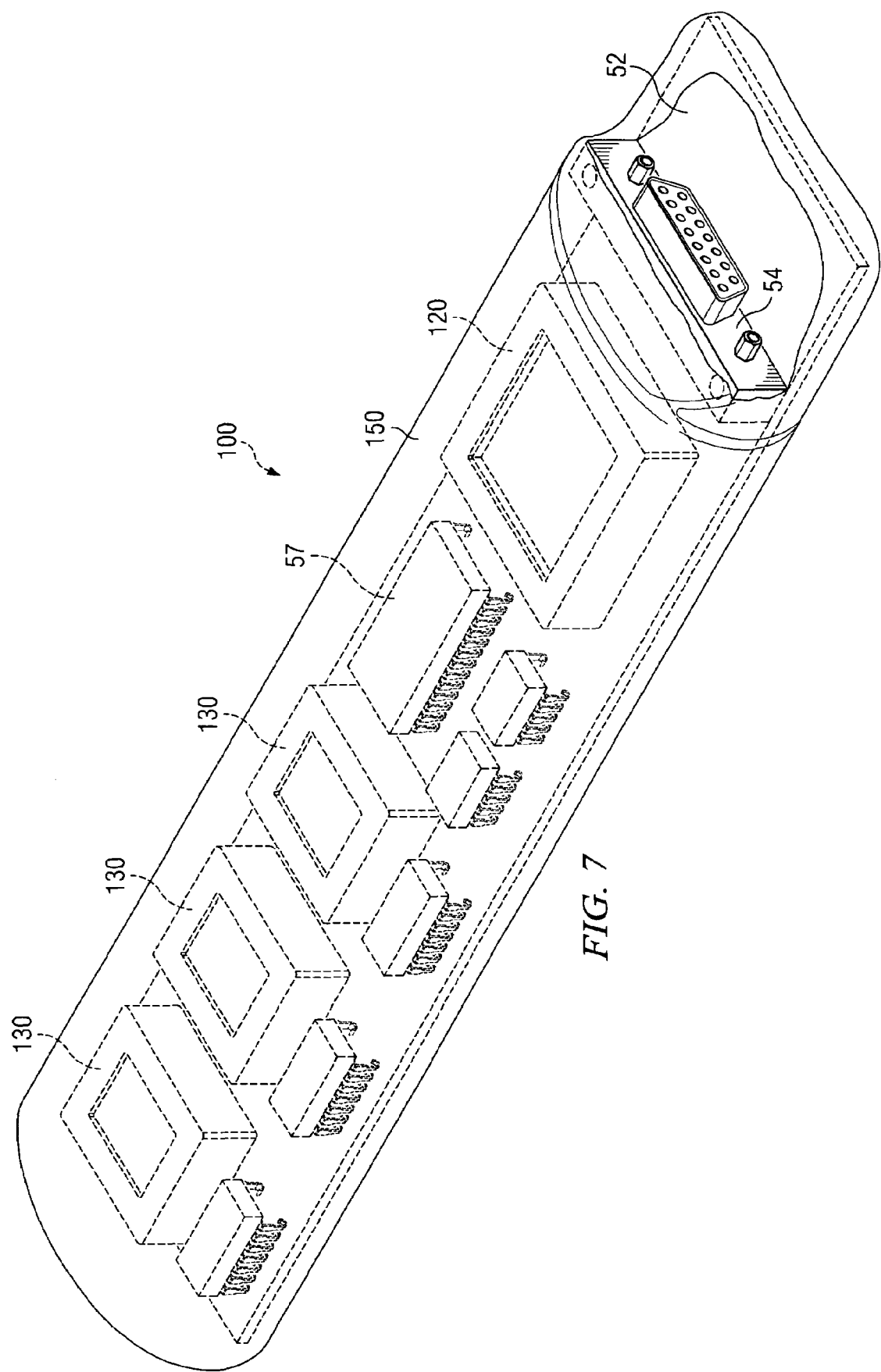
FIG. 7 depicts the exemplary circuit board assembly of FIG. 6 encapsulated in an encapsulating material.

With reference now to FIG. 7, it will be appreciated that electronic assembly 100 (including damming boots 120 and 130 deployed about corresponding integrated circuits 55 and 56) may also be encapsulated as shown at 150. Substantially any suitable encapsulation method and material may be utilized. For example, electronic assembly 100 may be encapsulated using an elastomeric material as disclosed in the More patent. Alternatively, assembly 100 may be encapsulated using a thermally conductive solid silicone rubber, such as TC100U available, for example, from Industrial Tape and Supply Company, Marietta, Ga. It will be appreciated that assembly 100 may also be enclosed in a molded preform as disclosed in the Gross publications.

It will be appreciated by those of ordinary skill in the art that the invention is not limited to use with integrated circuit components (e.g., as shown on FIG. 5). Damming boots in accordance with this invention may also be deployed about one or more discrete components such as resistors, capacitors, diodes, oscillating crystals, and the like. For example, in certain applications it has been observed that silicon based caulking materials can cause impedance changes in voltage reference diodes (especially at elevated temperatures). Deployment of a damming boot about the voltage reference diode tends to substantially eliminate such impedance changes (by isolating the leads from the caulking material). It will be also be understood that exemplary damming boots in accordance with this invention may be deployed about a portion of a circuit board including a plurality of discrete and/or integrated circuit components, for example, to isolate and protect the component leads.

Although the present invention and its advantages have been described in detail, it should be understood that various changes, substitutions and alternations can be made herein without departing from the spirit and scope of the invention as defined by the appended claims.

I claim:

1. An electronic assembly for use in a downhole tool, the assembly comprising:
    a circuit board;
    a plurality of integrated circuit packages deployed on the circuit board, each integrated circuit package including a plurality of electrically conductive leads protruding from a solid body, the integrated circuit packages in electrical communication with the circuit board via the plurality of leads; and
    at least one damming boot deployed about at least one of the integrated circuit packages, the damming boot including a solid housing sized and shaped such that (i) an inner surface thereof sealingly engages an outer, peripheral surface of the solid body, (ii) a lower face of the damming boot sealingly engaging the circuit board, and (iii) an inner surface of an enlarged lower opening is spaced apart from an outer surface of the leads.

2. The electronic assembly of claim 1, further comprising an electrical connector disposed to provide electrical communication between the integrated circuit packages and other devices in the downhole tool.

3. The electronic assembly of claim 1, wherein the circuit board, the plurality of integrated circuit packages, and the at least one damming boot are encapsulated in an encapsulating material.

4. The electronic assembly of claim 1, wherein the damming boot is disposed to house the leads of the at least one integrated circuit package in a substantially sealed cavity between the circuit board, the solid body, and an inner surface of the damming boot.

5. The electronic assembly of claim 1, wherein the lower face of the damming boot is sealed to the circuit board via an adhesive.

6. The electronic assembly of claim 1, wherein the damming boot comprises an open top.

7. The electronic assembly of claim 1, wherein the damming boot is disposed to provide structural support for the at least one integrated circuit package.

8. The electronic assembly of claim 1, wherein the damming boot is fabricated from an electrically insulating material.

9. The electronic assembly of claim 1, wherein the damming boot is fabricated from a material having a coefficient of thermal expansion less than about $16 \times 10^{-6}$.

10. A method for fabricating an electronic assembly for a downhole tool, the method comprising:
    (a) providing a circuit board having a plurality of integrated circuit packages deployed thereon; and
    (b) deploying a damming boot about at least one of the integrated circuit packages, the damming boot including a solid housing sized and shaped to be deployed about the at least one integrated circuit package such that (i) an inner surface of the housing sealing engages an outer, peripheral surface of a body portion of the at least one integrated circuit package, (ii) a lower face of the housing sealingly engages the circuit board, and (iii) an inner surface of an enlarged lower opening of the housing is spaced apart from an outer surface of a plurality of electrically conductive leads.

11. The method of claim 10, further comprising:
    (c) applying an adhesive between a lower face of the housing and the circuit board.

12. The method of claim 10, further comprising:
    (c) encapsulating the damming boot, the at least one integrated circuit package, and at least a portion of the circuit board in an encapsulating material.

13. The method of claim 10, further comprising:
    (c) applying an adhesive between the inner surface of the damming boot and the body portion of the at least one integrated circuit package.

14. The method of claim 10, further comprising:
    (c) applying an adhesive between a lower face of the housing and the circuit board; and
    (d) encapsulating the damming boot, the at least one integrated circuit package, and at least a portion of the circuit board in an encapsulating material.

15. A downhole tool comprising:
    a downhole tool body configured for coupling with a drill string;
    a controller deployed in the tool body, the controller including at least one circuit board, the circuit board including at least one integrated circuit package, the integrated circuit package including a plurality of electrically conductive leads protruding from a solid body and in electrical communication with the circuit board;
    at least one damming boot deployed about at least one of the integrated circuit packages, the damming boot including a solid housing sized and shaped such that (i) an inner surface thereof sealingly engages an outer, peripheral surface of the solid body, (ii) a lower face of the damming boot sealingly engaging the circuit board, and (iii) an inner surface of an enlarged lower opening is spaced apart from an outer surface of the leads.

* * * * *